(12) United States Patent
Bernier et al.

(10) Patent No.: US 6,346,817 B1
(45) Date of Patent: Feb. 12, 2002

(54) FLOAT CURRENT MEASURING PROBE AND METHOD

(75) Inventors: Martin Bernier; Michel Mailloux, both of Québec (CA)

(73) Assignee: Multitel Inc., Quebec (CA)

( * ) Notice: Subject to any disclaimer, the term of this patent is extended or adjusted under 35 U.S.C. 154(b) by 0 days.

(21) Appl. No.: 09/559,804

(22) Filed: Apr. 27, 2000

(51) Int. Cl.$^7$ ................................................ H02J 7/00
(52) U.S. Cl. ..................................................... 324/426
(58) Field of Search ................................. 324/425, 426; 320/127

(56) References Cited

U.S. PATENT DOCUMENTS

| | | | |
|---|---|---|---|
| 3,594,628 A | * 7/1971 | Gutzmer et al. | 320/127 |
| 3,657,639 A | 4/1972 | Willihnganz | 324/433 |
| 4,086,392 A | 4/1978 | Mao et al. | 429/50 |
| 4,266,189 A | 5/1981 | Karlin et al. | 324/117 H |
| 4,349,614 A | 9/1982 | Werth | 429/50 |
| 4,413,221 A | * 11/1983 | Benjamin et al. | 320/129 |
| 4,433,294 A | * 2/1984 | Windebank | 324/426 |
| 4,560,937 A | * 12/1985 | Finger | 324/433 |
| 4,707,795 A | 11/1987 | Alber et al. | 702/63 |
| 4,886,980 A | 12/1989 | Fernandes et al. | 307/64 |
| 4,935,688 A | 6/1990 | Mistry et al. | 320/120 |
| 5,126,585 A | 6/1992 | Boys | 307/66 |
| 5,182,518 A | * 1/1993 | Stich et al. | 324/511 |
| 5,665,966 A | 9/1997 | Dahl et al. | 250/281 |
| 5,786,682 A | 7/1998 | Aiken et al. | 320/136 |
| 5,886,503 A | 3/1999 | McAndrews et al. | 320/121 |
| 5,969,625 A | 10/1999 | Russo | 340/636 |

FOREIGN PATENT DOCUMENTS

WO 9853335 11/1998

OTHER PUBLICATIONS

"Assessment of Lead–Acid Battery State of Charge by Monitoring Float Charging Current" by Kyle D. Floyd et al., 1994 IEEE.

"An Innovative Digital Float Current Measurement Technique—Part One" by Arnold J. Brown et al., pp. 1–7, Date:.

* cited by examiner

Primary Examiner—Peter S. Wong
Assistant Examiner—Pia Tibbits
(74) Attorney, Agent, or Firm—Altera Law Group LLC

(57) ABSTRACT

A float current probe measuring a float current flowing in a conductor comprises a core adapted to be magnetically coupled to the conductor. Excitation and field cancellation windings are magnetically coupled to the core. A detector detects when energy in the excitation winding reaches a predetermined threshold corresponding to a saturated core condition. A timer measures first and second delays needed to saturate the core as a result of the excitation winding being energized through a switch circuit in the forward and reverse polarity successively. A computing unit determines a magnetic field induced by the conductor based on the first and second measured delays. The field cancellation winding is energized by a current source with a current level and direction as a function of the computed magnetic field, to cancel the magnetic field induced by the conductor. The current level is representative of the float current in the conductor.

20 Claims, 8 Drawing Sheets

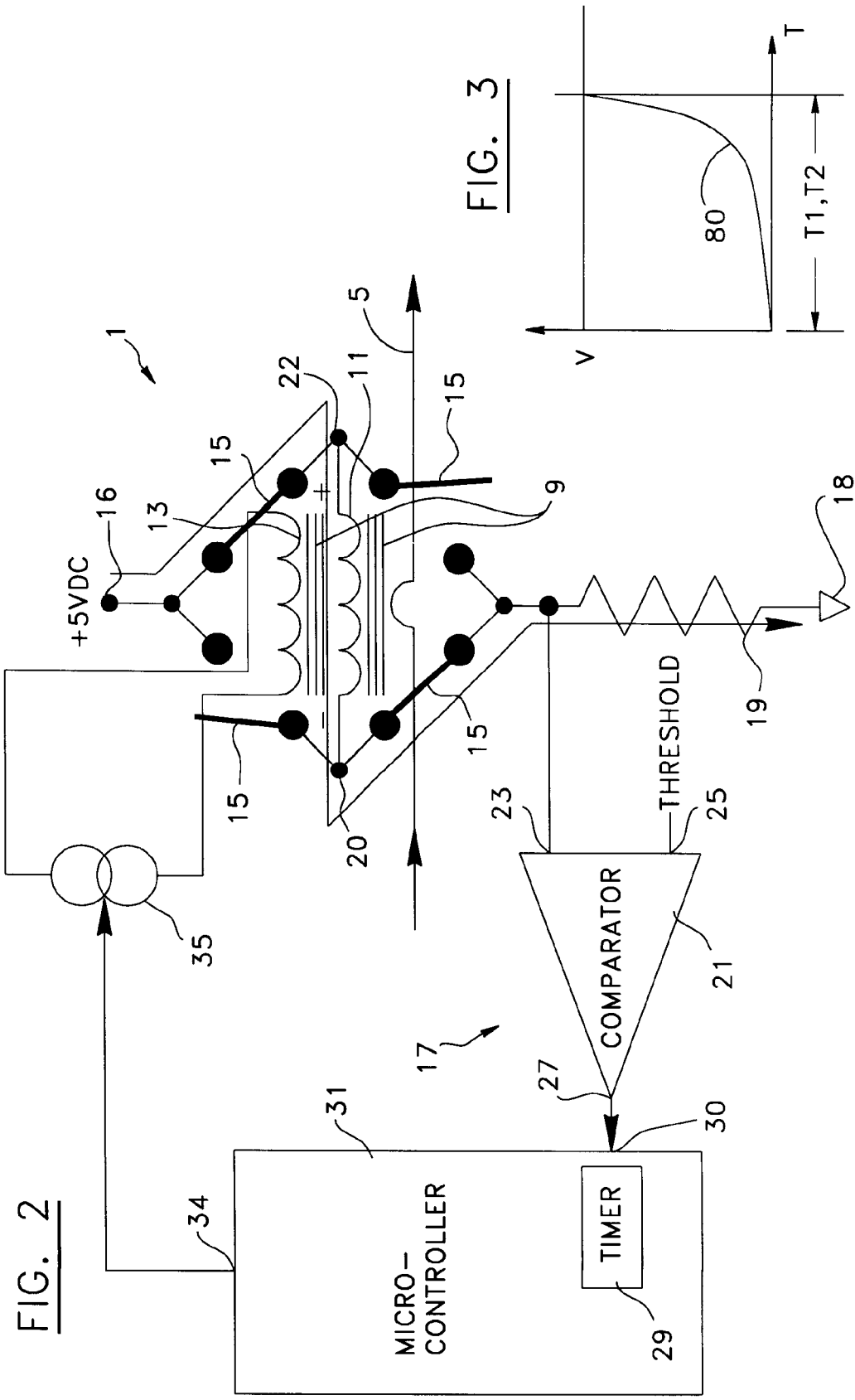

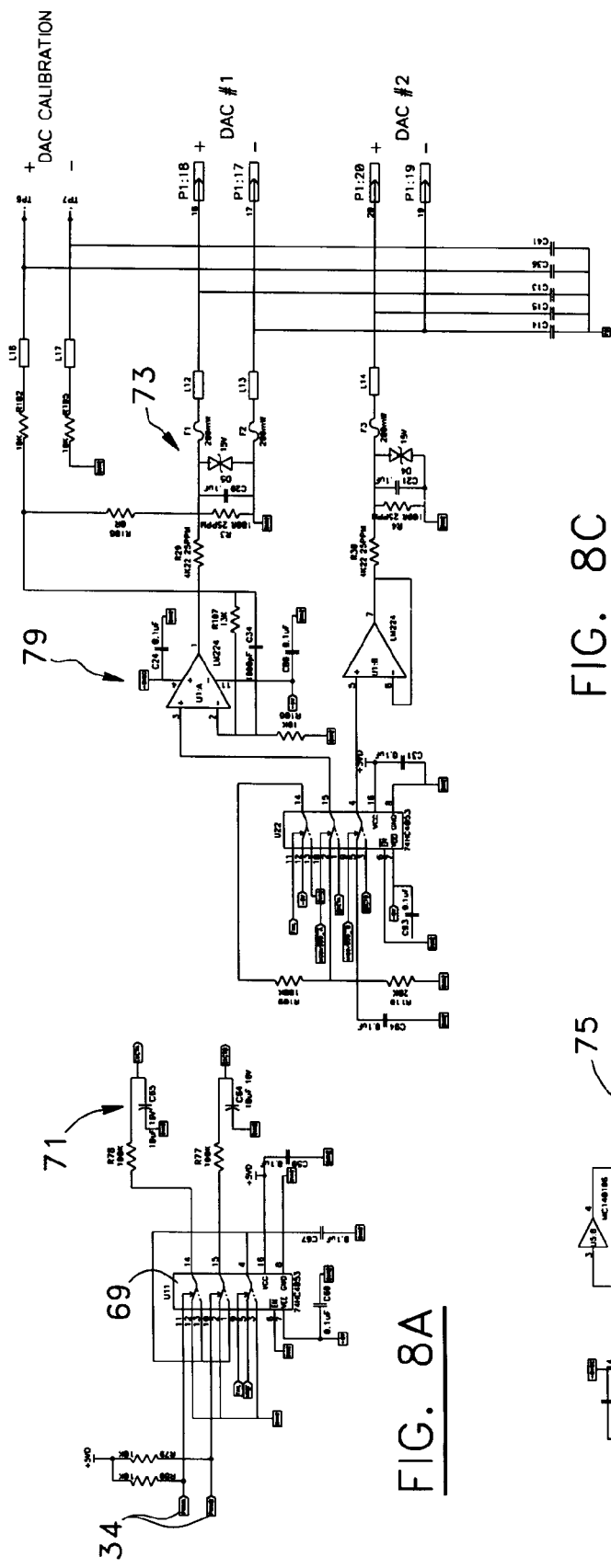
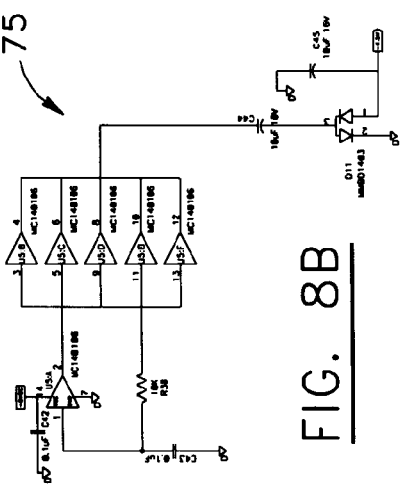
FIG. 8A
FIG. 8B
FIG. 8C

FLOAT CURRENT MEASURING PROBE AND METHOD

FIELD OF THE INVENTION

The present invention relates to measurement of float current, and more particularly to a float current probe and a measuring method that can be used for measuring float current for example in a battery string used as a backup power supply unit for telecommunication equipment, for battery state monitoring purposes.

BACKGROUND

Telecommunication systems are usually powered with direct current through rectifiers. Backup units are also provided since communication systems must remain operational for emergencies even during power failures, as prescribed by the national regulations in the majority of the industrialized countries. The backup units are usually formed of storage batteries, most of the time VRLA (Valve Regulated Lead Acid) batteries.

Real-time monitoring of the state and the condition of the batteries is necessary to detect eventual problems that would arise from a defective or an old battery. Many monitoring techniques have been developed for this purpose, like those involving impedance or mid-point measurements, yielding mixed results. Float current measurement has attracted attention just recently. There is a typical float current for every battery type, and this current tends to change as a function of the ageing and the temperature of the battery under scrutiny.

Float current is a precursory indicator of certain problems associated to battery backup units, as reported in the article entitled "ASSESSMENT OF LEAD-ACID BATTERY STATE OF CHARGE BY MONITORING FLOAT CHARGING CURRENT" by Kyle D. Floyd et al., 1994 IEEE. A certain assessment of the batteries' health can be carried out by time-trend analysis of the float current, thereby assisting in anticipating or detecting certain problems. By monitoring the float current, it is possible to detect a thermal runaway, which is some kind of race condition. This phenomenon is caused by a defective battery whose float current increases for any reason whatsoever. The direct effect of such an increase of the float current is an increase of the battery temperature which, in turns, causes an increase of the float current and so on, hence a race condition. The monitoring of the float current can also be used to detect an open string of batteries, since the float current then becomes nil.

One of the main desired features of a float current detector is the capacity to read very low DC current levels in the presence of high AC currents (up to 20 Amps) while being unaffected by high DC currents when a power failure occurs or during the battery recharging process. Some known float current detectors use a shunt with a high gain amplifier. The main drawback of this type of detector is that it requires the installation of a shunt, which is generally undesirable. A ferrite core with a Hall effect sensor can be used, but this kind of detector is sensible to the high remanence of this type of core.

Known in the art are U.S. Pat. Nos.: 3,657,639 (WILLIHNGANZ); 4,086,392 (MAO et al.); 4,266,189 (KARLIN et al.); 4,349,614 (WERTH); 4,707,795 (ALBER et al.); 4,886,980 (FERNANDES et al.); 4,935,688 (MISTRY et al.); 5,126,585 (BOYS: John T.); 5,665,966 (DAHL et al.); 5,786,682 (AIKEN et al.); 5,886,503 (McANDREWS et al.); 5,969,625 (RUSSO); and PCT patent application published under no. WO 98/53335 (JOKINEN), which show various devices and methods for monitoring string of batteries or for measuring currents, subjected to some or many of the following drawbacks: the battery branch must be opened to use the device; the device is not or is poorly immune to noise; in the case of a shunt device, the installation of the shunt is difficult and expensive; the measurement is inaccurate.

SUMMARY

An object of the invention is to provide a float current probe and a measuring method, which overcome the drawbacks of the prior art devices and methods.

Another object of the invention is to provide such a float current probe and a measuring method, which provide more accurate results as it is less sensible to ambient temperature variations and construction details, and is much more immune to noise.

Another object of the invention is to provide such a float current probe and a measuring method, which can be installed and used without interrupting the operation and without opening a circuit branch of the equipment to be monitored.

Another object of the invention is to provide such a float current probe which may be defective without harming the equipment under monitoring.

According to the present invention, there is provided a float current probe for measuring a float current flowing in a conductor, comprising:

a split core adapted to be magnetically coupled to the conductor;

an excitation winding magnetically coupled to the core;

a field cancellation winding magnetically coupled to the core;

a switch circuit means coupled to the excitation winding, for controllably energizing and de-energizing the excitation winding in selectable forward and reverse polarity successively;

detecting means coupled to the excitation winding, for detecting when energy in the excitation winding reaches a predetermined threshold corresponding to a saturated core condition;

a timer responsive to the detecting means, and measuring first and second delays needed to saturate the core as a result of the excitation winding being energized through the switch circuit means in the forward and reverse polarity successively;

computing means for determining a magnetic field induced by the conductor based on the first and second delays measured by the timer; and a current source means coupled to the field cancellation winding, for energizing the field cancellation winding with a current level and direction as a function of the magnetic field computed by the computing means, and thereby substantially cancelling the magnetic field induced by the conductor;

whereby the current level is representative of the float current in the conductor.

According to the present invention, there is also provided a method of measuring a float current flowing in a conductor, comprising the steps of:

magnetically coupling a split core with the conductor;

magnetically coupling an excitation winding and a field cancellation winding with the core;

cyclically energizing and de-energizing the excitation winding in forward and reverse polarity successively;

detecting when energy in the excitation winding reaches a predetermined threshold corresponding to a saturated core condition;

timing first and second delays needed to saturate the core as a result of the excitation winding being energized in the forward and reverse polarity successively;

determining a magnetic field induced by the conductor based on the first and second delays; and energizing the field cancellation winding with a current level and direction as a function of the magnetic field, and thereby substantially cancelling the magnetic field induced by the conductor;

whereby the current level is representative of the float current in the conductor.

The probe can be used for measuring float current in any type of battery backup units subjected to a constant charging current for compensating intrinsic losses, like units based on VRLA or NiCd batteries. It can equally be used in UPS (Uninterruptible Power Supply) units involving AC backup power sources. The probe can be installed without opening the battery branch, as a result of the use of a split core. The measurement is more accurate as the core is always used at a virtually same magnetization point while the float current is measured as a function of the generated opposite magnetic field required to cancel the magnetic field induced by the conductor.

BRIEF DESCRIPTION OF THE DRAWINGS

A detailed description of preferred embodiments will be given herein below with reference to the following drawings, in which like numbers refer to like elements:

FIGS. 1 and 2 are schematic simplified circuit diagrams of a float current probe according to the present invention, operating in forward and reverse polarity modes respectively;

FIG. 3 is a graph illustrating a typical curve of the voltage detected by a float current probe as a function of time, according to the present invention;

FIGS. 8A–C are circuit diagrams illustrating, when combined together, an embodiment of the DAC sections shown in FIG. 4.

DETAILED DESCRIPTION OF THE PREFERRED EMBODIMENTS

Referring to FIG., 4 there is shown a circuit diagram illustrating a possible embodiment of the float current probe 1 according to the present invention. The probe 1 has a sensor section 3 for measuring a float current flowing in a conductor 5. The probe 1 can be designed to operate with two sensor sections (as in the illustrated case) or more, resulting in savings as many sections of the probe 1 can be shared for this purpose.

The probe 1 may be built around a main board 7 on which the electronic components of the probe 1 are mounted.

Figure 7:
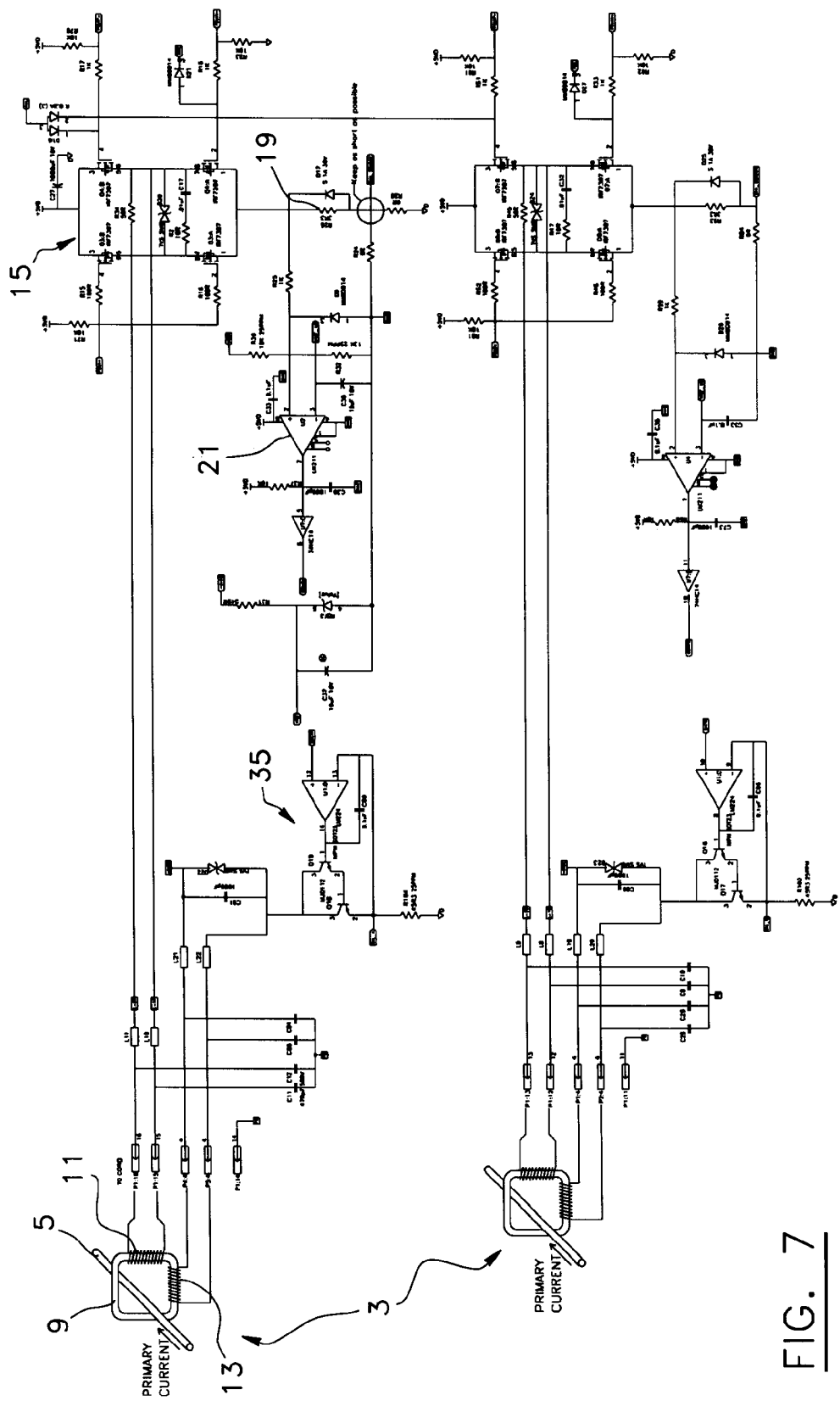
FIG. 7 is a circuit diagram illustrating an embodiment of the current source and sensor sections shown in FIG. 4.

Referring to FIG. 7, the sensor section 3 consists of a core 9 preferably designed to encircle the conductor 5, for magnetic coupling therewith. Any other coupling arrangement and design can be used, so long as it results in a magnetic coupling of the core 9 with the conductor 5. The core 9 may be made of two separate ferrite U-shaped portions joined together to form what is called a split core 9. This split core 9 may be easily opened and closed around the conductor 5 so as to be magnetically coupled thereto, without any disconnection of the conductor 5. Such a feature is particularly useful in backup units used for example in telecommunication systems where a service interruption is unaffordable.

A typical use of the float current probe 1 according to the present invention is for measuring a low DC float current in a rechargeable battery string (not shown). It should be understood that the probe 1 can be used for other applications as well.

An excitation winding 11 and a field cancellation winding 13 are wound around the core 9, and are thus magnetically coupled thereto. Typical values of turns are N=400 for the excitation winding 11 and N=100 for the field cancellation winding 13. Other turn ratios can be used depending on the needs.

Figure 1:
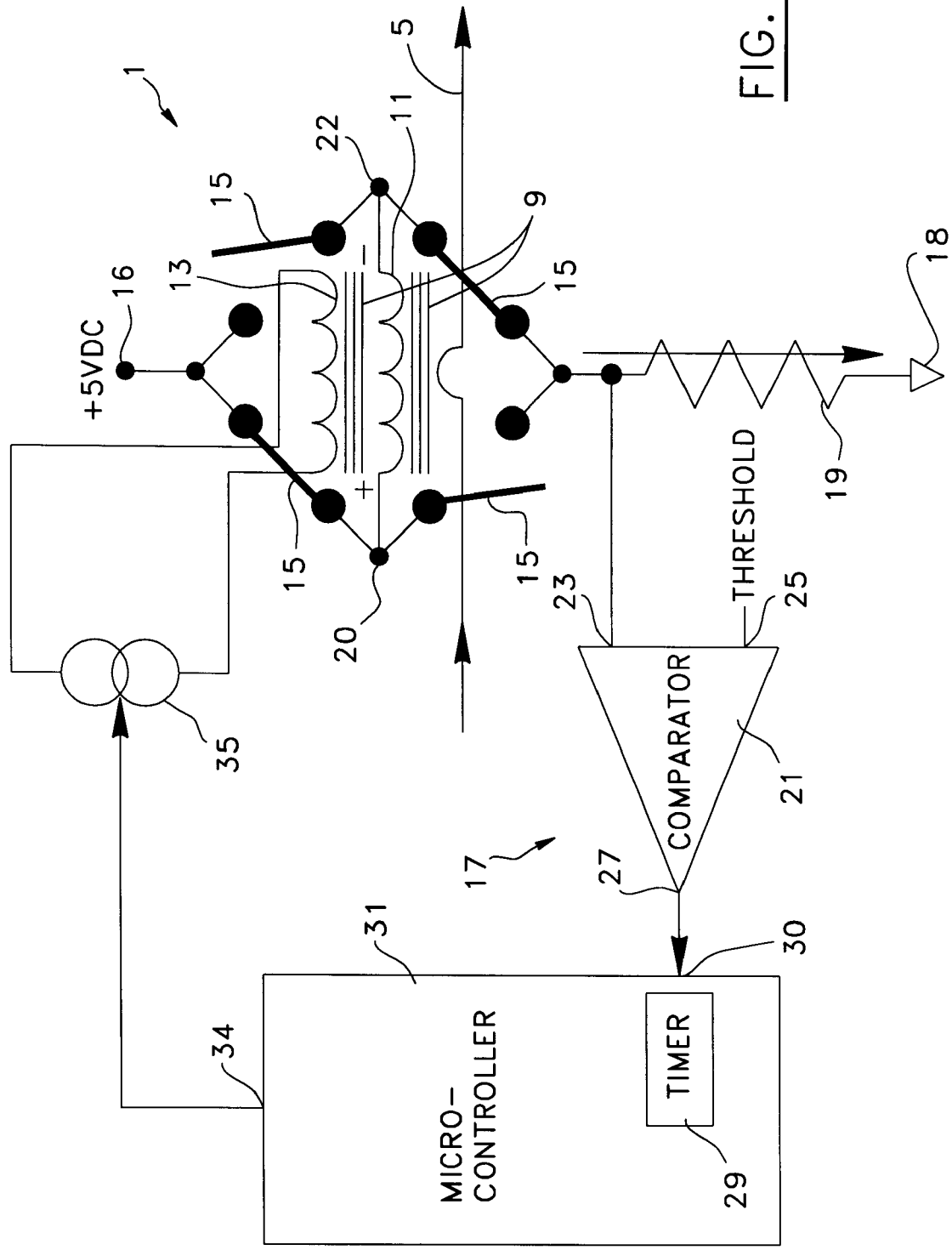
Figure 4:
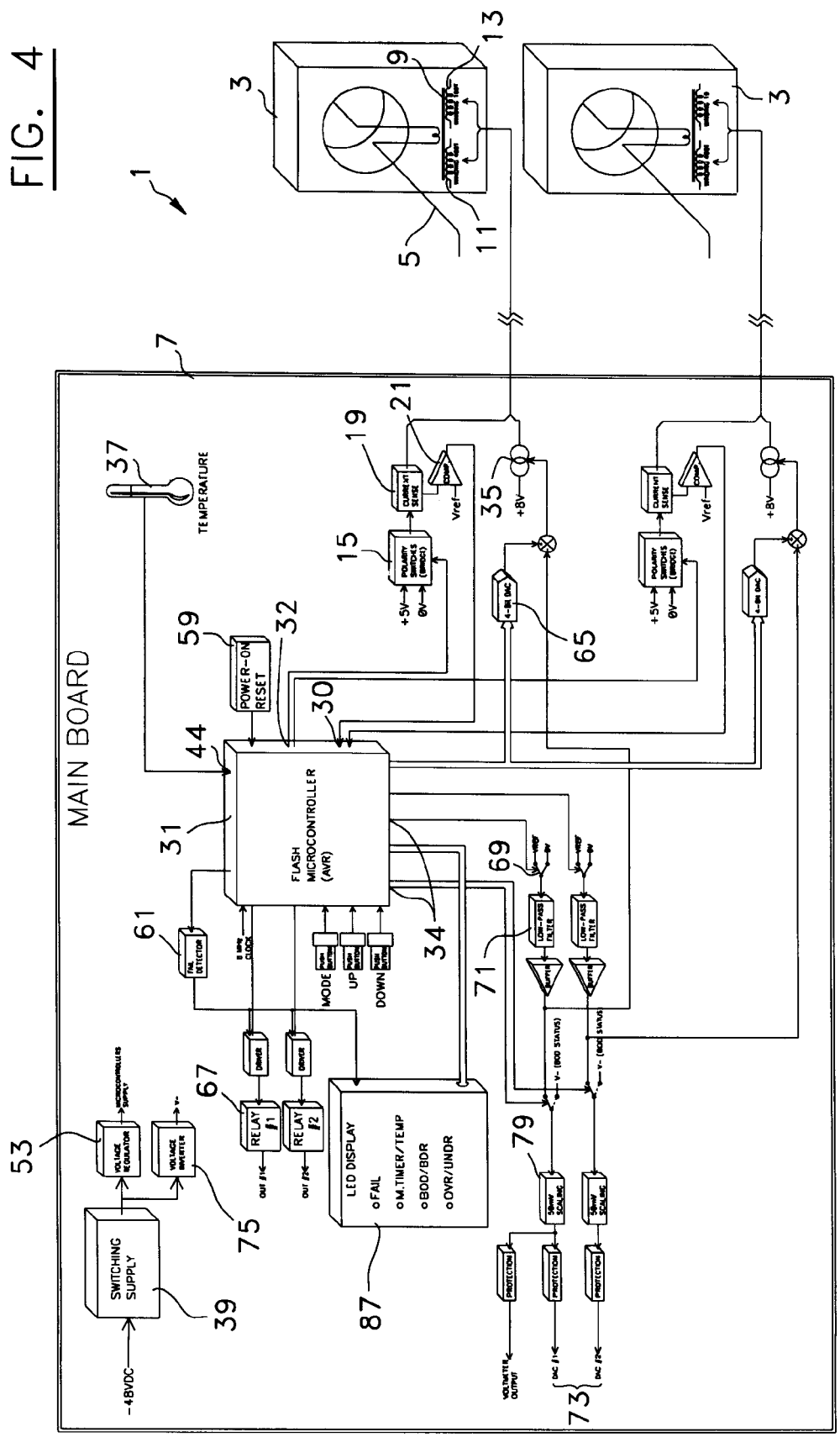
FIG. 4 is a schematic circuit diagram of a float current probe according to the invention, with two sensor sections.

Referring to FIGS. 1, 2, and 4, an arrangement of switches 15 is provided for controllably energizing and de-energizing the excitation winding 11 in selectable forward and reverse polarity successively, as shown respectively in FIGS. 1 and 2. The switches 15 are mounted in a bridge configuration connected between a voltage source 16 of for example +5V DC and a ground 18. In this configuration, the excitation winding 11 is connected between opposite intermediate bridging interconnections 20, 22 of the switch arrangement. Any other switch circuit whereby the desired end result that the core 9 can be energized and de-energized can be used.

A detector 17 formed for example of a shunt resistor 19 and a comparator 21 is coupled to the excitation winding 11, for detecting when the energy in the excitation winding 11 reaches a predetermined threshold corresponding to a saturated core condition. The shunt resistor 19 is positioned between the ground 18 and the bridge of switches 15. The comparator 21 has a first input 23 connected between the shunt resistor 19 and the bridge of switches 15, a second input 25 receiving a reference voltage signal representing the threshold, and an output 27 producing a triggering signal reporting when a voltage signal on the first input 23 exceeds the reference voltage signal on the second input 25. Other detector configurations allowing to detect that the core 9 has reached a saturation level can be used as well.

A timer 29 responsive to the detector 17 is provided to measure first and second delays T1, T2 needed to saturate the core 9 as a result of the excitation winding 11 being energized through the bridge of switches 15 in the forward and reverse polarity successively, as depicted by FIGS. 1 and 2 respectively. For this purpose, the timer 29 is connected to the output 27 of the comparator 21. Preferably, the timer 29 is conveniently embodied in a microcontroller 31 having an input 30 receiving the triggering signal from the output 27 of the comparator 21. But the timer 29 could also be embodied by any other suitable circuit outside the microcontroller 31.

Referring to FIG. 3, curve 80 illustrates a typical voltage across the shunt resistor 19 as detected by the comparator 21 as a function of time. The first and second delays (T1, T2) are the time periods needed to reach a voltage threshold corresponding to the saturated core condition in the forward and reverse polarity respectively. As shown in FIG. 3, the voltage (and thus the current through the excitation winding 11) rises strongly near the saturated core condition.

A computing device preferably embodied in the microcontroller 31 determines a magnetic field induced by the conductor 5, based on the first and second delays T1, T2 measured by the timer 29.

A current source 35 is coupled to the field cancellation winding 13. The current source 35 is used to energize the field cancellation winding 13 with a current level and direction as a function of the magnetic field computed by the computing device, in order to substantially cancel the magnetic field induced by the conductor 5. The great advantages resulting from this field cancellation will become apparent hereinafter, as the current level produced for cancelling the field is representative of the float current in the conductor 5. The current source 35 is connected to an output 34 of the microcontroller 31, while the microcontroller 31 also has a switch control output 32 connected to the switches 15, for control purposes.

An important feature of the float current probe 1 according to the invention resides in its ability to measure relatively low level DC currents in the presence of high level AC or DC currents.

In operation, the microcontroller 31 operates the switches 15 to form a first circuit path between the voltage source 16 and the ground 18, resulting in the energizing of the excitation winding 11 in the forward polarity as shown in FIG. 1. At the same time, the timer 29 is started. When the excitation winding 11 reaches the predetermined threshold corresponding to the saturated core condition as reported by the detector 17 generating the triggering signal, the delay T1 given by the timer 29 is stored in memory in the microcontroller 31. The microcontroller 31 operates the switches 15 to open the first circuit path with the excitation winding 11 being left open to de-energize the core 9 through the +5V supply 16 for a predetermined time during which the energy stored in the core 9 is released. The microcontroller 31 then operates the switches 15 to form a second circuit path between the voltage source 16 and the ground 18, resulting in the excitation winding 11 being energized in the reverse polarity as shown in FIG. 2. At the same time, the timer 29 is started again. When the excitation winding 11 reaches the predetermined threshold corresponding to the saturated core condition as reported by the detector 17 generating the triggering signal, the delay T2 given by the timer 29 is stored in memory in the microcontroller 31. The microcontroller 31 operates the switches 15 to open the second circuit path so that the excitation winding 11 (just like the core 9) is de-energized for a predetermined time during which the energy stored in the core 9 is released.

A measure of the actual current in the conductor 5 will be proportional to the difference between T1 and T2 measured by the timer 29, as the actual current flowing in the conductor 5 creates a magnetic flux offset in the core 9, which varies the actual values of T1 and T2. The sign of the T1 and T2 difference will be indicative of the direction of the current flowing in the conductor 5.

However, the detected delay difference is not perfectly linear and the ambient temperature has a major effect on this. Also, the mechanical fitting between the U-shaped portions of the core 9 has a major effect on the flux density for the same float current. Added to these problems is an observed time drift. Problems also arise for rejecting AC current variations affecting the measurement of the float current.

The field cancellation winding 13 magnetically coupled to the core 9 and used to continuously cancel the magnetic field detected by the T1–T2 calculation by control of the current source 35 overcomes the above problems. This closed loop architecture has a great impact on temperature stability, and the linearity is improved because the core 9 is always at the substantially same magnetization point (zero). At the same time, the actual float current is advantageously derived from the current flowing in the field cancellation winding 13 rather than from the T1–T2 calculation. The T1–T2 differential is thus used to control the magnetic field cancellation process in the core 9.

In brief, the bridge of switches 15 is turned-on for each polarity until core saturation occurs. The saturation level is detected by the arrangement formed of the shunt resistor 19 and the comparator 21 with respect to a voltage reference Vref. When the core 9 saturates, the current in the excitation winding 11 increases sharply (see FIG. 3) and this level is detected by the comparator 21. The resulting triggering signal is transmitted to the microcontroller 31 which will stop the acquisition timer 29 and turn-off the bridge of switches 15 to release the energy stored in the core 9 and prepare it for the next saturation cycle.

The microcontroller 31 calculates a value of the field induced by the conductor 5 (which also provides a relative value of the actual float current level) by the differential time between the opposite polarity saturation delays T1–T2. Provided that the microcontroller 31 comprises built-in DAC functions, then the field value is used to drive the DAC output 34, which is a simple PWM 69 with a low-pass filter 71 which rejects the AC component of the binary modulation. The PWM signal is transmitted to two circuits. It is first transmitted to a scaling circuit 79, which brings the full scale of the PWM signal (Vref) to a +50 mV scale. This output is available to an external system (not shown), which can display and process the scaled signal representative of the actual float current level. The PWM signal is also transmitted to the current source 35 for the purpose of cancelling the actual magnetic field induced by the conductor 5. The reason for this is to bypass the flux core variations over time and temperature. The actual float current level is no longer derived from a T1–T2 calculation but from the PWM controlled current source level. The T1–T2 level is only used to enable the microcontroller 31 to reach the 0 flux level in the core 9.

The scaled signal is calibrated by the microcontroller 31 by adjusting the specific counts to get a +50 mV accurate output signal. But the same PWM signal is transmitted to the current source 31 which cancels the conductor current by a fixed turns ratio, for example 1:100. A way to overcome this problem is to slightly change the PWM voltage to current gain. This can be done by a simple 4-bit DAC 65. This will enable the microcontroller 31 to get an accurate +50 mV output signal with a 5 A float current.

Because the float current level of a battery is influenced by ambient temperature, a temperature sensor 37 can be connected to an input 44 of the microcontroller 31 in order to modify each threshold relatively to the actual temperature.

Figure 5:
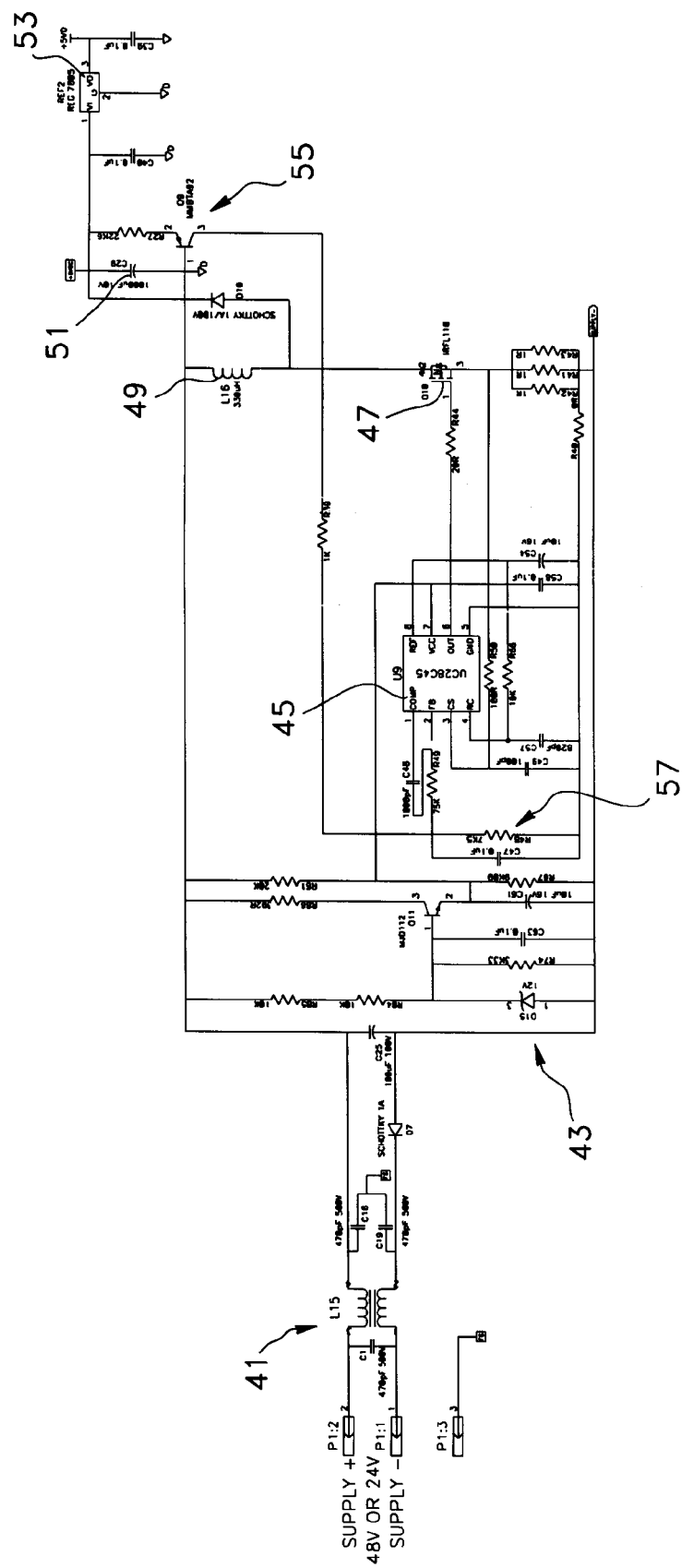
FIG. 5 is a circuit diagram illustrating an embodiment of the switching power supply section shown in FIG. 4.

To keep the design to a minimum cost, the probe 1 is provided with a switching supply 39 that does not use a transformer but only a choke 49 (see FIG. 5). This configuration limits the input voltage range between 16V and 75V, so it would be difficult to implement a 130V input with this kind of hardware. Also, no isolation is provided by this supply, so the DAC output reference is the same as the V+(BRG) input. However, other power supply configurations can be used if desired or needed.

Referring to FIG. 5, the switching supply 39 has a filter 41 used to reject all the ripple current generated by the switching supply 39. This type of filter 41 will reject most of differential and common mode noises. A +12 V linear supply 43 is provided to power the PWM controller 45. This controller 45 adjusts the conduction time duration of a MOSFET switch 47 to control the energy stored in the choke 49. This energy is then released during the off time of this MOSFET switch 47 to a charging capacitor 51 which will store the released energy cycle by cycle. As the energy stored in the capacitor 51 increases, its voltage will increase proportionally. To get a stable +8 V dc before a +5 V linear regulator 53, the actual voltage level is sent to the PWM controller 45 which adjusts the energy in the choke 49 to keep it at +8 V dc, not more, not less. Unfortunately, the +8 V dc level and the PWM controller 45 are not at the same reference. A voltage-to-current converter 55 converts the voltage level into a proportional current level which is provided to a current-to-voltage converter formed of resistor 57 referenced to the PWM controller 45. This technique has the advantage of transporting accurately a voltage level from one reference to another with a large common mode voltage between these two references. The recovered voltage level is used to close the loop in this regulated +8 V dc switching supply.

Figure 6:
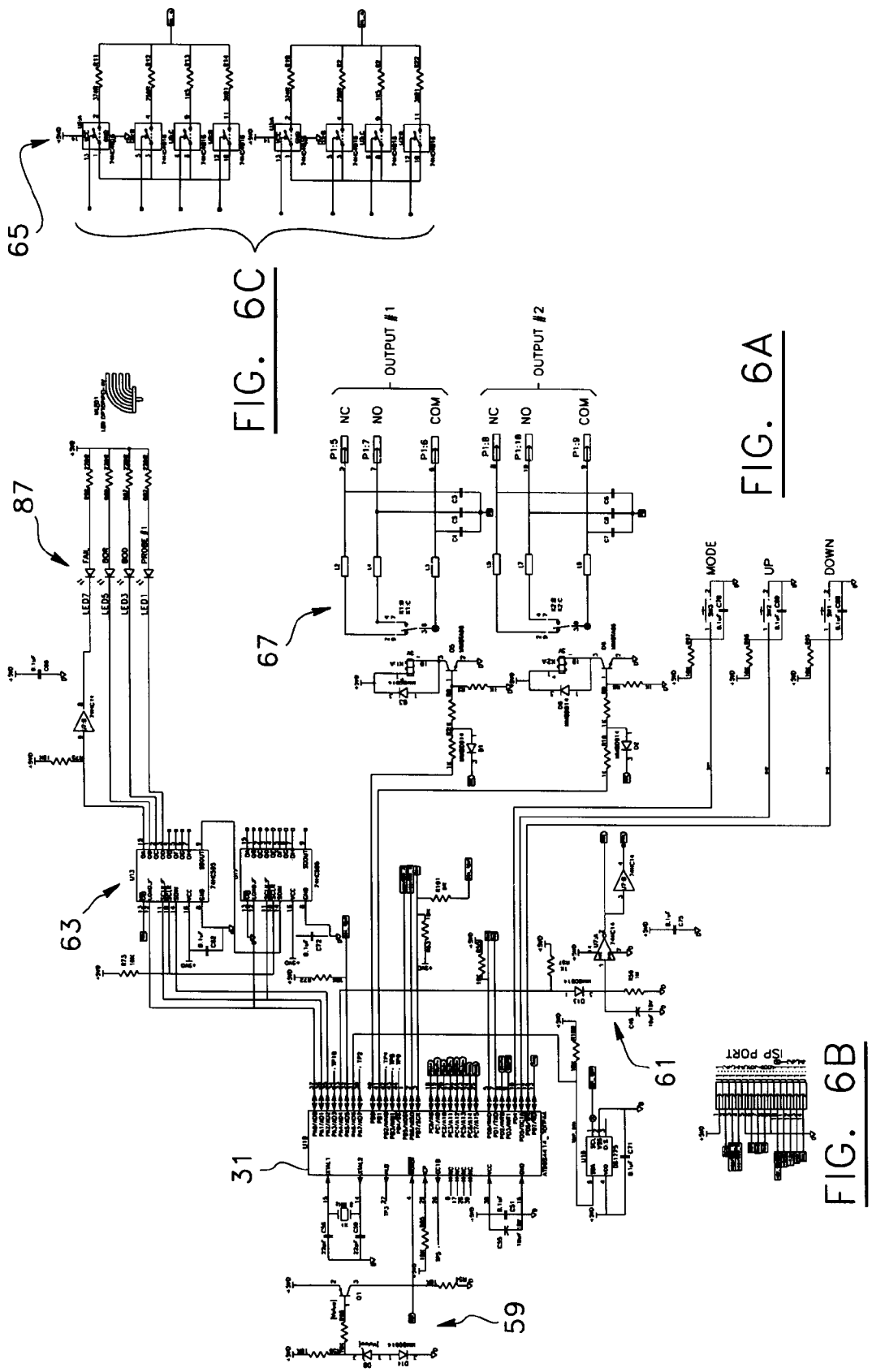
FIGS. 6A–C are circuit diagrams illustrating, when combined together, an embodiment of the microcontroller section shown in FIG. 4.

Referring to FIGS. 6A–C, the microcontroller 31 can be conveniently embodied by a AVR series microcontroller (AT90S8515). This controller has 8K of flash memory with 512 bytes of RAM and 512 bytes of EEPROM. To make sure that the EEPROM data is secure, a power-on reset circuit 59 is connected to the microcontroller 31 in order to force a reset if the +5 V dc supply is actually below 4 V dc. The microcontroller 31 has a built-in watchdog but no direct fail signal can be generated from that. An output port line is used to reset a hardware driven 4 seconds delay which can trigger the fail condition. This is performed by a fail detector circuit 61. When the microcontroller 31 starts, this output port pin is reset in order to disable the fail output. In the event of a reset, this pin is automatically set and a fail occurs after 4 seconds, which can be reported on a LED display circuit 87. To keep the pins counts to a minimum on the microcontroller 31, a shift register 63 using only 3 pins is used to drive the LEDs in the display circuit 87 and the two 4-BIT DACs 65. The shift register 63 that drives the LEDs is fail protected and will force the LEDs to a stable state during fail condition (all off, except fail LED on).

The 4-BIT DACs 65 are used to fine tune the gain of the current source 35 in each core 9 in order to adjust the +50 mV output gain.

Two output relays 67 can be controlled by the microcontroller 31, for external application purposes. They are forced to a non-energized state when in fail condition.

Referring to FIG. 7, the bridge of switches 15 is used to reverse the 5 V dc polarity on the excitation winding 11 or to release the energy (stop conduction). The shunt resistor 19 is used to detect the actual current in the excitation winding 11. The comparator 21 detects through the shunt resistor 19 when the core 9 is saturated. The voltage reference 25 is the actual threshold of the saturation state.

The current source 35 is used to generate a current in the field cancellation winding 13. This current will generate a magnetic flux, which is opposed to the one generated by the float current level. The current needed to cancel a 5 A float level with a 100 turns field cancellation winding 13 will be 5/100=50 mA.

Referring to FIGS. 8A–C, as seen hereinabove, the microcontroller 31 has two built-in PWM outputs 34 each controlling an analog switch 69. One side of this switch 69 is connected to the 0 V and the other side to the reference voltage level Vref. The common of the switch 69 is connected to the low pass filter 71, which will remove almost all the AC component of this modulation. The output of the filter 71 is an analog signal having a level which is proportional to the duty cycle of the PWM output and the rail-to-rail level is from 0 V and Vref. Because of microcontroller constraints, the PWM Max range will be limited to about 0.700 V dc. The PWM output 34 is connected to a voltage divider forming the scaling circuit 79 which will generate a 50 mV output 73 at 5 A for external connection.

A −6 V supply 75 is used for the muxes and op-amps negative supply.

Figure 9:
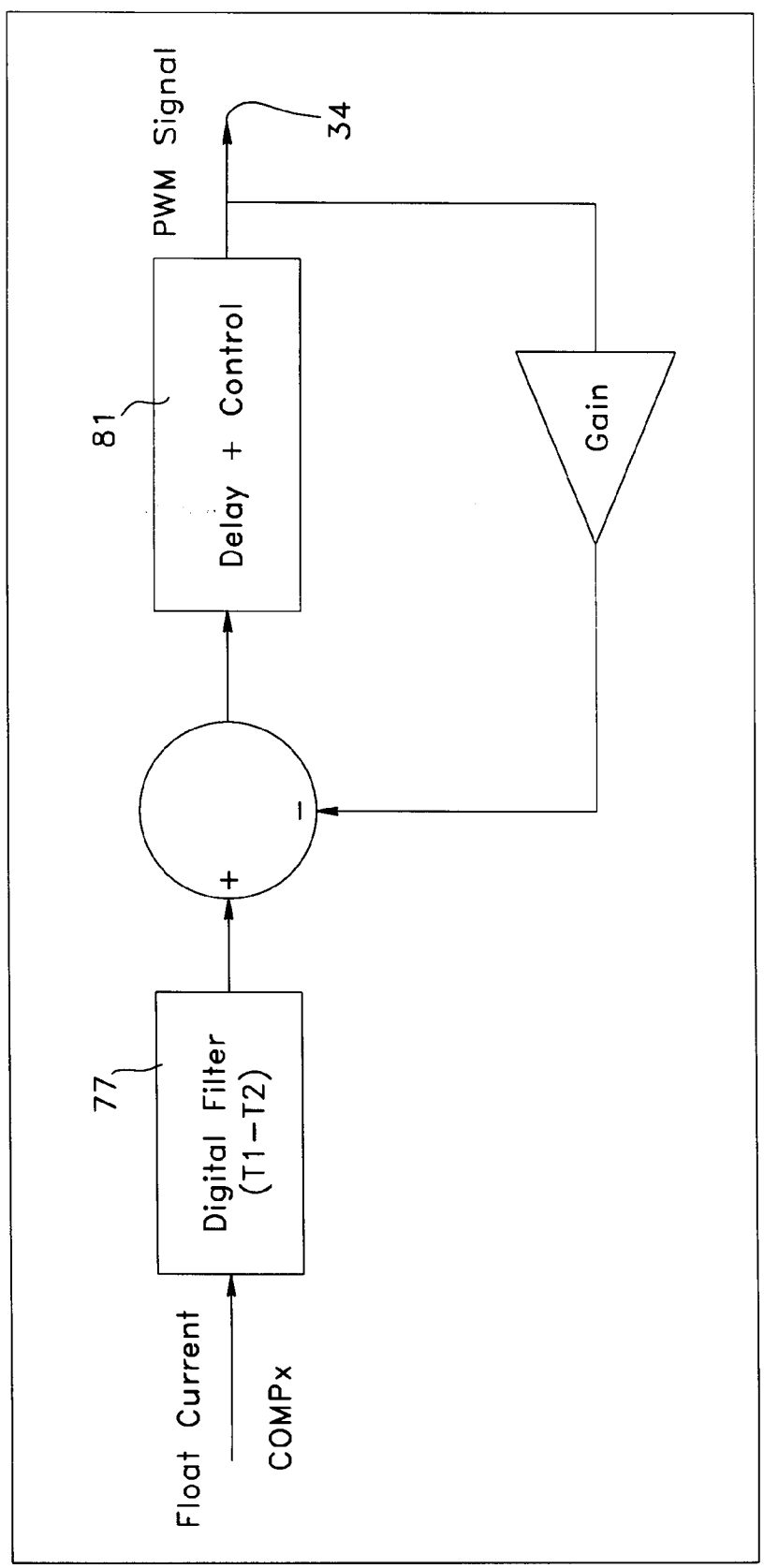
FIG. 9 is a block diagram illustrating an embodiment of a processing carried out by the microcontroller shown in FIG. 4.

Referring to FIG. 9, the microcontroller 31 can be configured to subject the positive polarity delay T1 and negative polarity delay T2 to a PID control to produce the PWM signal controlling the current source 35. The goal is to provide the field cancellation winding 13 with a current equal but opposite to the current flowing in the conductor 5, taking the turns ratios into account. A nil current is sought. It is thus a matter of injecting a current in order to compensate as best as possible for the float current, which in fact acts as an error control. The error of the feedback control must tend to zero. The value transmitted to the built-in DACs of the microcontroller 31 is calculated as follows:

set point=previous set point+Dt/32 where:

Dt=Filter (T1−T2)

T1, T2=positive and negative polarity delays

The purpose of the expression Dt/32 is to slow down and reduce the sudden changes of the set point. It acts as a proportional-derivative circuit.

If Dt<0, then set point=set point+1

If Dt>0, then set point=set point−1

This operation is carried out to avoid errors in steady state (which acts as an integrator) and to compensate for the error caused by the division. A delay 81 is also added to avoid oscillations and for adaptation with the speed of the digital filter 77. This delay acts as a filter for the PWM outputs 34. The acquisition filter function 77 can be of a first order recursive filter type with exponential averaging (low pass) in the form:

$$y(n)=Ax(n)+(1-A)y(n-1)$$

where A=0.002

This filter has a noise reduction variance 10 log (A/(2−A)), i.e. 30 dB. A time constant so slow allows to filter frequencies of for example a few tens of Hertz and above for a maximum of stability. Furthermore, a normal distribution modulation (gaussian) of the sampling rate (24–35 ms) allows to reject the spectral aliasing caused by an undersampling. This aliasing causes an AC current to be seen as a DC current close to the sampling rate (and its multiples). The slow response of the filter 77 suppresses the noise caused by such a modulation.

While embodiments of this invention have been illustrated in the accompanying drawings and described above, it will be evident to those skilled in the art that changes and modifications may be made therein without departing from the essence of this invention. All such modifications or variations are believed to be within the scope of the invention as defined by the claims appended hereto.

What is claimed is:

1. A float current probe for measuring a float current flowing in a conductor, comprising:

a core adapted to be magnetically coupled to the conductor;

an excitation winding magnetically coupled to the core;

a field cancellation winding magnetically coupled to the core;

a switch circuit coupled to the excitation winding, for controllably energizing and de-energizing the excitation winding in selectable forward and reverse polarity successively;

a detecting device coupled to the excitation winding, for detecting when energy in the excitation winding reaches a predetermined threshold corresponding to a saturated core condition;

a timer responsive to the detecting device, and measuring first and second delays needed to saturate the core as a result of the excitation winding being energized through the switch circuit in the forward and reverse polarity successively;

a computing device for determining a magnetic field induced by the conductor based on the first and second delays measured by the timer; and a current source coupled to the field cancellation winding, for energizing the field cancellation winding with a current level and direction as a function of the magnetic field computed by the computing device, and substantially cancelling the magnetic field induced by the conductor;

wherein the current level is representative of the float current in the conductor.

2. The float current probe according to claim 1, wherein the switch circuit comprises an arrangement of switches mounted in a bridge configuration connected between a voltage source and a ground, the excitation winding being connected between opposite intermediate bridging interconnections of the arrangement.

3. The float current probe according to claim 2, wherein the detecting device comprises a shunt between the ground and the arrangement of switches, and a comparator having a first input connected between the shunt and the arrangement of switches, a second input receiving a reference voltage signal representing the threshold, and an output connected to the timer and generating a timer triggering signal reporting when a voltage signal on the first input exceeds the reference voltage signal.

4. The float current probe according to claim 2, wherein the timer and the computing device are provided by a microcontroller having an input connected to the detector device to receive a timer triggering signal indicating the saturated core condition, a switch control output connected to the switches, and a current source control output connected to the current source, the microcontroller comprising devices for cyclically:

a) operating the switches to form a first circuit path between the voltage source and the ground resulting in the energizing of the excitation winding in the forward polarity, and starting the timer;

b) stopping the timer in response to the triggering signal produced by the detector device, and operating the switches to open the first circuit path for a predetermined time during which the energy stored in the core is released, a time then given by the timer representing the first delay;

c) operating the switches to form a second circuit path between the voltage source and the ground resulting in the energizing of the excitation winding in the reverse polarity, and starting the timer;

d) stopping the timer in response to the triggering signal produced by the detector device, and operating the switches to open the second circuit path for a predetermined time during which the energy stored in the core is released, a time then given by the timer representing the second delay; and e) calculating a differential time from the first and second delays and producing a control signal on the current source control output as a function of the differential time, the current level produced by the current source depending on the control signal, the differential time being representative of the magnetic field induced by the conductor.

5. The float current probe according to claim 1, wherein the timer and the computing device are provided by a microcontroller having an input connected to the detector device to receive a timer triggering signal, a switch control output connected to the switch circuit, and a current source control output connected to the current source.

6. The float current probe according to claim 5, further comprising a scaling circuit connected to the microcontroller and having an output to transmit a signal indicative of the current level produced by the current source for external processing.

7. The float current probe according to claim 5, wherein the microcontroller comprises PWM for producing a PWM control signal on the current source control output as a function of a differential time between the first and second delays, the float current probe further comprising a low pass filter connected between the current source control output and the current source to filter out AC components from the PWM control signal.

8. The float current probe according to claim 7, further comprising a fine tuning device coupled between the low pass filter and the current source and connected to the microcontroller, for fine tuning a gain of the current source.

9. The float current probe according to claim 5, further comprising a temperature sensor connected to microcontroller, the temperature providing an ambient temperature reading, the microcontroller comprising an adjustor for adjusting the predetermined threshold.

10. The float current probe according to claim 5, wherein the microcontroller comprises:

a PID circuit for respectively subjecting the first and second delays to a P.I.D. control, a result of which is used in producing a control signal on the current source control output.

11. The float current probe according to claim 5, further comprising a display connected to the microcontroller, for reporting selected operating mode and detected failure conditions of the microcontroller.

12. The float current probe according to claim 1, wherein the conductor is a cable interconnecting a battery string.

13. The float current probe according to claim 1, further comprising a switching power supply means for producing power supply signals compatible with logic control circuits of the system and energy levels required for energization of the excitation and field cancellation windings.

14. The float current probe according to claim 1, wherein the core is a split core removably mountable around a section of the conductor.

15. A method of measuring a float current flowing in a conductor, comprising:

magnetically coupling a split core with the conductor;

magnetically coupling an excitation winding and a field cancellation winding with the core;

cyclically energizing and de-energizing the excitation winding in forward and reverse polarity successively;

detecting when energy in the excitation winding reaches a predetermined threshold corresponding to a saturated core condition;

timing first and second delays needed to saturate the core as a result of the excitation winding being energized in the forward and reverse polarity successively;

determining a magnetic field induced by the conductor based on the first and second delays; and energizing the field cancellation winding with a current level and direction as a function of the magnetic field, and thereby substantially cancelling the magnetic field induced by the conductor;

whereby the current level is representative of the float current in the conductor.

16. The method according to claim 15, wherein the detecting comprises shunting the excitation winding and comparing a diverted current with a reference current value representing the threshold, the saturated core condition being established when the diverted current exceeds the threshold.

17. The method according to claim 15, wherein the cyclically energizing and de-energizing is carried out through a switch circuit connected between a voltage source and a ground and providing electrical paths passing through the excitation winding in opposite directions corresponding to the forward and reverse polarity respectively.

18. The method according to claim 17, wherein the timing and determining are carried out by a microcontroller also controlling the switch circuit.

19. The method according to claim 15, wherein the energizing the field cancellation winding comprises the steps of generating a PWM signal as a function of a differential time between the first and second delays, filtering and scaling the PWM signal, and using the PWM signal as a control signal of a current source producing said current level in the field cancellation winding.

20. The method according to claim 15, further comprising the measuring an ambient temperature and adjusting the threshold as a function of the ambient temperature.

* * * * *